United States Patent [19]
Pan

[11] Patent Number: 5,814,863
[45] Date of Patent: Sep. 29, 1998

[54] SUBSTRATE WITH GATE ELECTRODE POLYSILICON/GATE OXIDE STACK COVERED WITH FLUORINATED SILICON OXIDE LAYER AND FLUORINATED CORNERS OF GATE OXIDE LAYER

[75] Inventor: Yang Pan, Singapore, Singapore

[73] Assignee: Chartered Semiconductor Manufacturing Company, Ltd., Singapore, Singapore

[21] Appl. No.: 868,604

[22] Filed: Jun. 4, 1997

Related U.S. Application Data

[62] Division of Ser. No. 652,882, May 23, 1996, Pat. No. 5,672,525.

[51] Int. Cl.$^6$ ................................................. H01L 29/78
[52] U.S. Cl. ...................... 257/346; 257/344; 257/410; 257/413
[58] Field of Search .................... 257/344, 346, 257/410, 413

[56] References Cited

U.S. PATENT DOCUMENTS

| | | |
|---|---|---|
| 4,007,294 | 2/1977 | Woods et al ............................. 257/410 |
| 4,748,131 | 5/1988 | Zietlow ..................................... 437/24 |
| 4,994,404 | 2/1991 | Sheng et al. ............................ 257/344 |
| 5,108,935 | 4/1992 | Rodden ..................................... 437/24 |
| 5,372,951 | 12/1994 | Anjum et al. ............................ 437/24 |
| 5,552,332 | 9/1996 | Tseng et al. ............................ 257/346 |
| 5,672,525 | 9/1997 | Pan .......................................... 257/346 |
| 5,698,883 | 12/1997 | Mizuno .................................... 257/344 |

*Primary Examiner*—Gene M. Munson
*Attorney, Agent, or Firm*—George O. Saile; Stephen B. Ackerman; Graham S. Jones, II

[57] ABSTRACT

A method of forming an FET transistor comprises forming a stack of a gate oxide layer and a control gate electrode on a surface of a doped semiconductor substrate with counter-doped source/drain regions therein. A silicon oxide layer is formed over the stack of the gate oxide layer and the control gate electrode and exposed portions of the semiconductor substrate including the source/drain regions. Then the silicon oxide layer and the corners of the gate oxide layer are fluorinated by rapid thermal processing providing a fluorinated silicon oxide layer. The rapid thermal processing is performed in an atmosphere of $NF_3$ gas and $O_2$ gas at a temperature from about 900° C. to about 1050° C. for a time duration from about 10 seconds to about 50 seconds, and the fluorinated silicon oxide layer has a thickness from about 200 Å to about 400 Å.

15 Claims, 5 Drawing Sheets

SUBSTRATE WITH GATE ELECTRODE POLYSILICON/GATE OXIDE STACK COVERED WITH FLUORINATED SILICON OXIDE LAYER AND FLUORINATED CORNERS OF GATE OXIDE LAYER

This application is a division of U.S. patent application Ser. No. 08/652,882, filed on May 23, 1996, which has issued as U.S. Pat. No. 5,672,525.

BACKGROUND OF THE INVENTION

1. Field of the Invention

This invention relates to MOS FET transistor devices and more particularly to a method and a design to provide improved hot carrier immunity.

2. Description of Related Art

In the past transistors with fluorine in the gate oxide layer have been employed to enhance hot carrier reliability. However, gate oxide thickening is undesirable.

SUMMARY OF THE INVENTION

Problems encountered in providing hot carrier immunity are shown by the embodiments of FIGS. 3 and 4. The problem is that it has been found that while fluorine in the gate oxide layer of an FET device will improve hot carrier reliability, gate oxide thickening is undesirable.

FIG. 4 shows an FET transistor device 110 manufactured with LDD regions 120, 120' as well as source/drain regions 122/122'. The P- doped silicon semiconductor substrate 112 has an upper surface upon which is formed a fluorinated gate oxide layer 118 composed of silicon oxide. The gate oxide layer 118, which has a thickness from about 50 Å to about 150 Å, is formed by the process of thermal processing or CVD (chemical vapor deposition) processing.

A polysilicon gate electrode 116 has been formed over the exposed top surface of gate oxide layer 118. Layer 116 has been highly doped with phosphorus (P) or arsenic (As) dopant with a concentration from about $10^{19}$ atoms/cm$^3$ to about $5\times10^{21}$ atoms/cm$^3$ formed by ion planting at an energy level from about 20 keV to about 50 keV.

A tungsten silicide (WSi$^x$) layer is then deposited by a CVD process based on a SiH$_4$ and WF$_6$ reaction. Fluorine is introduced into the polysilicon and consequently to the gate oxide by the annealing cycle. Fluorine (F) concentration is from about $1\times10^{20}$ atoms/cm$^3$ to about $1\times10^{22}$ atoms/cm$^3$.

Lightly doped (LDD) regions 120 and 120' have been formed in the substrate 112 aside from the gate electrode 116. Source/drain regions 122/122' have been formed in the substrate 112 aside from silicon spacers 140 which are formed adjacent to the gate electrode 116.

FIG. 5 shows an FET transistor device 130 manufactured with source/drain regions 144/144', but without any LDD regions. The P- doped silicon semiconductor substrate 132 has an upper surface upon which is formed a gate oxide layer 138 composed of silicon oxide. The gate oxide layer 138 has a thickness from about 50 Å to about 150 Å is formed by the process of thermal processing or CVD (chemical vapor deposition) processing.

A polysilicon gate electrode 136 has been formed over the exposed top surface of fluorinated gate oxide layer 138. Layer 136 has been highly doped with As or P dopant with a concentration from about $1\times10^{19}$ atoms/cm$^3$ to about $5\times10^{21}$ atoms/cm$^3$ formed by ion implanting at an energy level from about 20 keV to about 50 keV.

A tungsten silicide (WSi$_x$) layer is then deposited by a CVD process based on a SiH$_4$ and WF$_6$ reaction. Fluorine is introduced into the polysilicon and consequently to the gate oxide by the annealing cycle. The resulting fluorine (F) concentration is from about $1\times10^{20}$ atoms/cm$^3$ to about $1\times10^{22}$ atoms/cm$^3$.

Source/drain regions 144/144' have been formed in the substrate 132.

Disadvantages of fluorinated gate dielectrics are as follows:

1. More traps—P channel/hot electron much worse;
2. Gate oxide charge to breakdown is reduced;
3. Fluorine (F) in gate oxide changes dielectric constant reduces current driver;
4. If too much fluorine (F) the gate oxide thickness is increased and that also reduces the current driver.

An FET transistor in accordance with this invention comprises a stack of a gate oxide layer and a control gate electrode on a surface of a doped semiconductor substrate with counterdoped source/drain regions therein. The control gate electrode may be formed of a polysilicon and tungsten silicide (WSi$_x$). A WSi$_x$ layer may be deposited by chemical vapor deposition (CVD) by the reaction of dichlorosilane (DCS) SiH$_2$Cl$_2$ and tungsten hexafluoride (WF$_6$) which does not introduce significant fluorine (F) into the gate oxide layer. A silicon oxide layer is formed over the stack of the gate oxide layer and the control gate electrode and exposed portions of the semiconductor substrate where the source/drain regions of the transistor are formed. The silicon oxide layer and the corners of the gate oxide layer have been fluorinated by rapid thermal processing providing a fluorinated silicon oxide layer.

In accordance with another aspect of this invention, an FET transistor includes the following features. A stack of a gate oxide layer and a control gate electrode is formed on a surface of a doped semiconductor substrate with counterdoped source/drain regions therein. A silicon oxide layer is formed over the stack of the gate oxide layer and the control gate electrode and exposed portions of the semiconductor substrate including the source/drain regions. The silicon oxide layer and the corners of the gate oxide layer having been fluorinated by rapid thermal processing providing a fluorinated silicon oxide layer.

The rapid thermal processing was performed at a temperature from about 900° C. to about 1050° C. for a time duration from about 10 seconds to about 50 seconds and the fluorinated silicon oxide layer has a thickness from about 200 Å to about 400 Å.

Further in accordance with this invention, an FET transistor has the following features. A stack of a gate oxide layer and a control gate electrode is formed on a surface of a doped semiconductor substrate with counterdoped source/drain regions therein. A silicon oxide layer overlies the stack of the gate oxide layer and the control gate electrode and exposed portions of the semiconductor substrate including the source/drain regions. The silicon oxide layer has a thickness from about 200 Å to about 400 Å. The silicon oxide layer and the corners of the gate oxide layer have been fluorinated by rapid thermal processing provide a fluorinated silicon oxide layer.

Preferably, the rapid thermal processing was performed in an atmosphere of NF$_3$ gas and O$_2$ gas at a temperature from about 900° C. to about 1050° C. for a time duration from about 10 seconds to about 50 seconds, and the fluorinated silicon oxide layer has a thickness from about 200 Å to about 400 Å. The control gate electrode comprises a polycide structure comprising a layer of polysilicon and a tungsten silicide layer.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

In accordance with this invention, an FET transistor comprises a stack of a gate oxide layer and a control gate electrode on a surface of a doped semiconductor substrate with counterdoped source/drain regions therein. A silicon oxide layer is formed over the stack of the gate oxide layer and the control gate electrode and exposed portions of the semiconductor substrate including the source/drain regions of a transistor. The silicon oxide layer has a thickness from about 200 Å to about 400 Å. The silicon oxide layer and the corners of the gate oxide layer have been fluorinated by rapid thermal processing providing a fluorinated silicon oxide layer. The rapid thermal processing was performed in an atmosphere of $NF_3$ gas and $O^2$ gas at a temperature from about 900° C. to about 1050° C. for a time duration from about 10 seconds to about 50 seconds, and the fluorinated silicon oxide layer has a thickness from about 200 Å to about 400 Å.

This invention suggests reoxidation of polysilicon in $O_2$ and $NF_3$ by RTP (Rapid Thermal Processing also known as RTA or Rapid Thermal Annealing) as a simple approach to incorporate fluorine (F) only at the gate edge of an MOS FET device to reduce overlap capacitance and improve HCI (Hot Carrier Injection) without oxide thickening.

The process includes the steps as follows:

A. Define a polysilicon gate electrode over a gate oxide layer.

B. Regrow or deposit a thin oxide layer over the gate electrode.

C. Treatment of the device by RTP in an atmosphere of $O_2$ & $NF_3$ for both P & N channel devices is possible, i.e. there is no problem. The process involves RTP in $O_2$ & $NF_3$ (900° C. to 1050° C. for 10 seconds to 50 seconds) fluorine (F) incorporation into gate oxide only in the corner of the gate electrode. Advantages of the process of this invention are as follows:

1. Improve N- channel HCI;
2. Reduce N- channel & P- channel overlap capacitance;
3. The process is simple;
4. A single drain could be used.

FIGS. 1A–1J show the process of manufacture of a MOS FET transistor device 10 on a P- substrate or well 12 in accordance with this invention. Alternatively an N- substrate or well can be used.

Figure 1A:
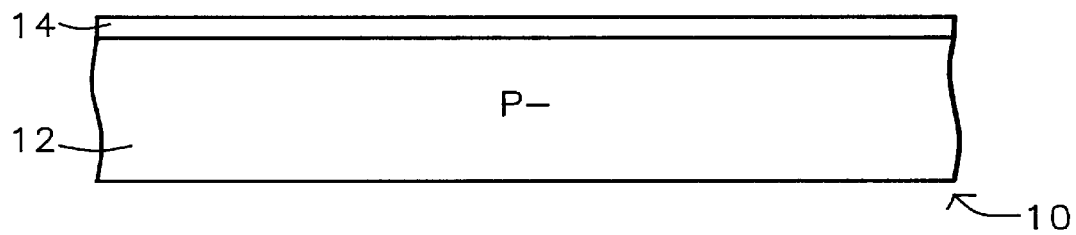
FIGS. 1A–1J show the process of manufacture of a MOS FET transistor device 10 on a P- substrate or well 12 in accordance with this invention. Alternatively an N- substrate or well can be used.

FIG. 1A shows the device 10 in an early stage of manufacture with a P- doped silicon semiconductor substrate 10 (or a well 10) having an upper surface upon which a blanket gate oxide layer 14 composed of silicon oxide has been formed. The gate oxide layer 14 has a thickness from about 50 Å to about 150 Å is formed by thermal processing or chemical vapor deposition.

Figure 1B:
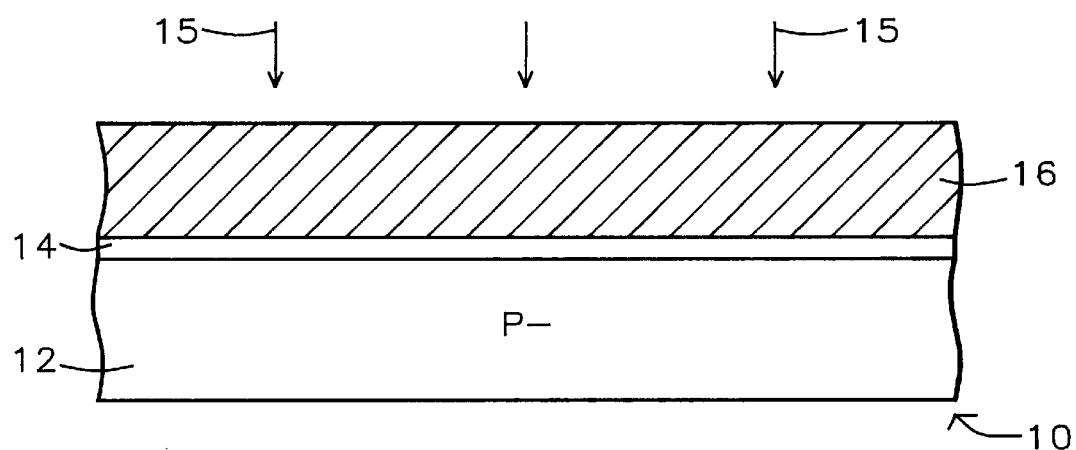

FIG. 1B shows the device 10 FIG. 1A after a blanket layer of polysilicon 16 (for a gate electrode) has been formed over the exposed top surface of gate oxide layer 14. Layer 16 has been highly doped with arsenic (As) or phosphorus (P) dopant 15 with a concentration from about $1\times10^{19}$ atoms/$cm^3$ to about $5\times10^{21}$ atoms/$cm^3$ formed by ion implanting at an energy level from about 20 keV to about 50 keV. Alternatively, layer 16 could be a stack consisting of polysilicon and tungsten silicide ($WSi_x$) which is deposited by CVD involving the reaction of dichlorosilane (DCS) $SiH_2Cl_2$ and tungsten hexafluoride ($WF_6$), which does not introduce significant fluorine (F) into the gate oxide layer 14.

Figure 1C:
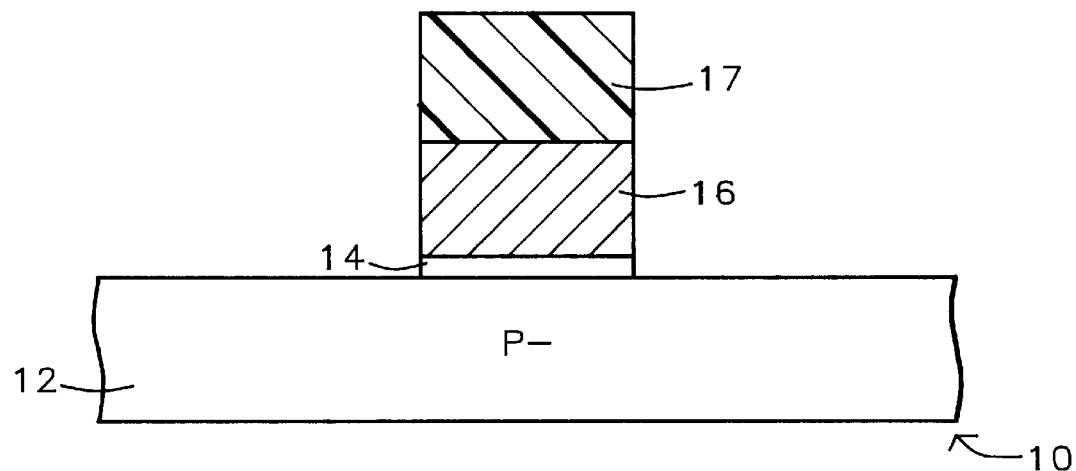

FIG. 1C shows the device 10 of FIG. 1B after a gate electrode mask 17 has been formed over the layer 16 and used during patterning of the gate electrode 16 and the gate oxide layer 14 by etching away the portions of those layers unprotected by the mask 17. Portions of the top surface of the substrate 12 from which layers 14 and 16 have been removed are exposed.

Figure 1D:
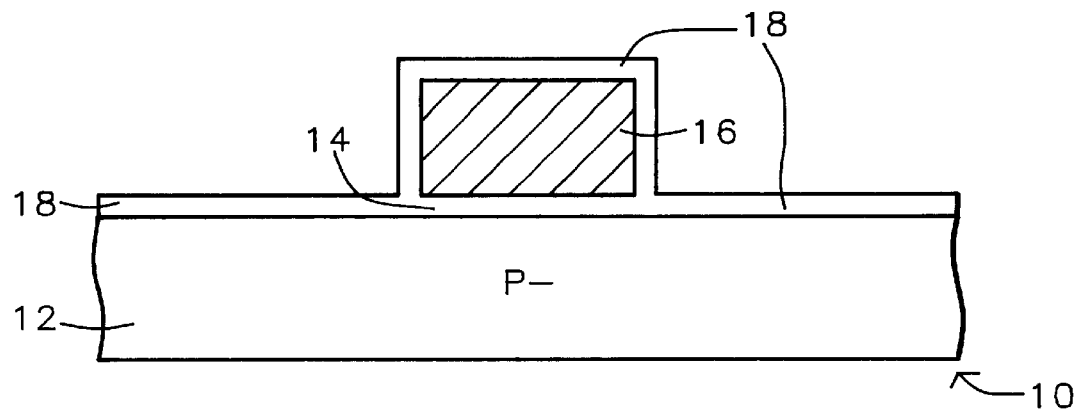

FIG. 1D shows the device 10 of FIG. 1C after a blanket thin silicon oxide dielectric layer 18 has a thickness from about 200 Å to about 400 Å is formed by the process of LPCVD (Low Pressure Chemical Vapor Deposition) or thermal processing.

The parameters of the process for forming the dielectric layer 18 are within the range from about 600° C. to about 750° C. for an LPCVD process or from 850° C. to about 920° C. for thermal processing.

Figure 1E:
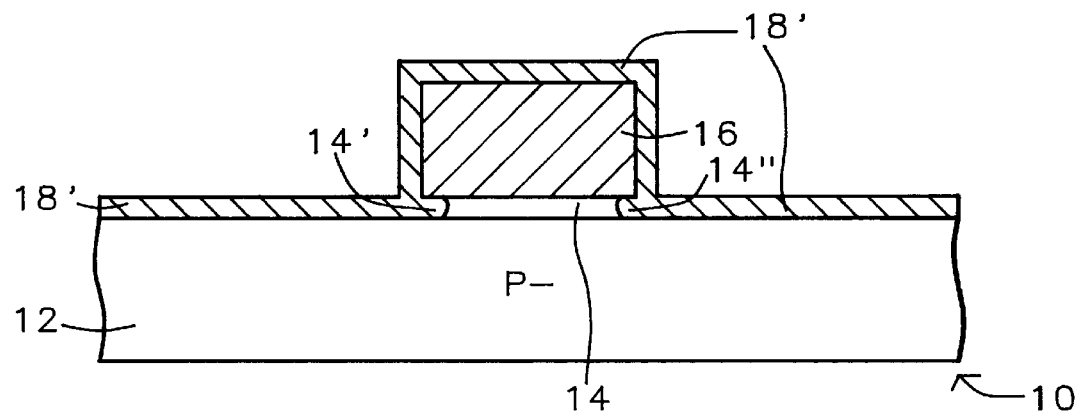

FIG. 1E shows the device 10 of FIG. 1D after it has been subjected to rapid thermal processing, oxidation and fluorination (i.e. treatment with fluorine) of layer 18 into a fluorinated (i.e. having fluorine in combination) layer 18'. The process of fluorination and oxidation is performed in a chamber which is first evacuated and then filled with a gaseous atmosphere of oxygen gas ($O_2$) and nitrogen trifluoride gas ($NF_3$) at a temperature from about 900° C. to about 105° C. for a duration from about 10 seconds to about 50 seconds converting the silicon oxide layer 18 into a layer 18' composed of a silicon oxide and fluorine. The resulting fluorine (F) concentration is from about $5\times10^{20}$ atoms/$cm^3$ to about $1\times10^{22}$ atoms/$cm^3$. Layer 18' has a thickness from about 200 Å to about 400 Å, which was the thickness of layer 18 prior to fluorination.

Note that the treatment by fluorination and oxidation in a gaseous atmosphere of oxygen gas ($O_2$) and nitrogen trifluoride gas ($NF_3$) will not change the thickness of oxide layer 18 when it it is converted to layer 18'. The reduction in the overlap capacitance is mainly attributable to the change in the dielectric constant.

The resulting layer 18' with silicon oxide layer and fluorine includes portions 14' and 14" of the gate oxide layer 14 at the periphery of the gate electrode 16 just above the substrate 12. The fluorine incorporated in layer 14 extends between about 100 Å to about 500 Å from the sidewall of the gate electrode 16 beneath the lower surface of the gate electrode 16 in portions 14' and 14".

Figure 1F:
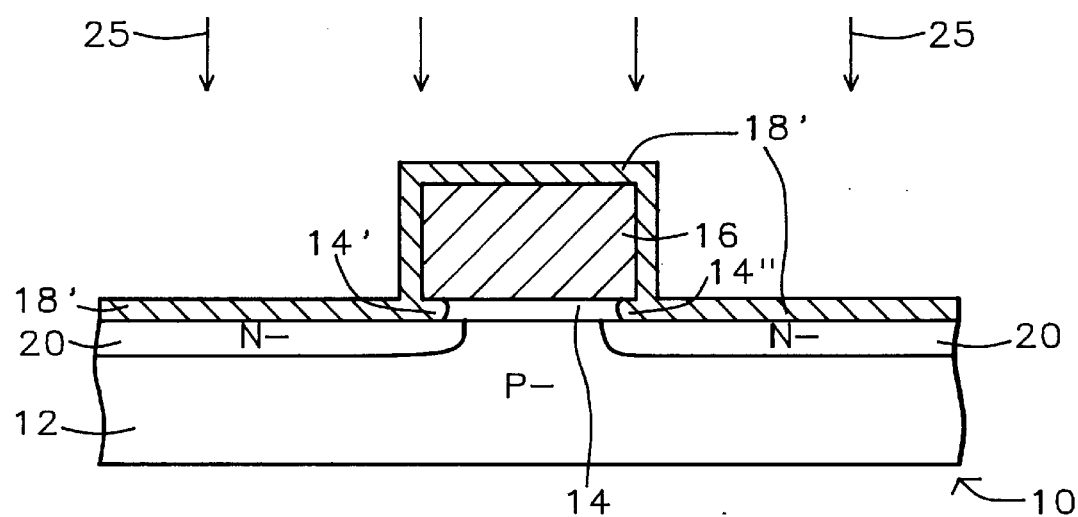

FIG. 1F shows the device 10 of FIG. 1E after the lightly doped drain N- doped regions 20, 20' are formed on either side of the gate electrode 16 by ion implantation with ions 25. LDD regions 20, 20' are lightly doped in a process of self-aligned doping of those regions with phosphorus (P) or arsenic (As) dopant 25 with a concentration from about about $1\times10^{17}$ atoms/cm$^3$ to about $5\times10^{18}$ atoms/cm$^3$ formed by ion implanting at an energy level from about 25 keV to about 80 keV.

Figure 1G:
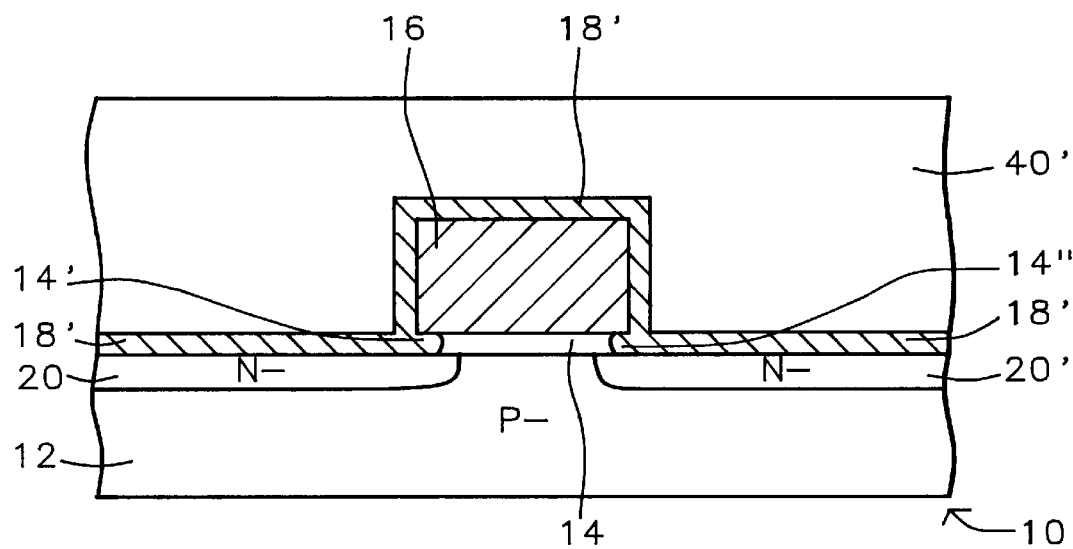

FIG. 1G shows the device 10 of FIG. 1F after a formation of a blanket silicon dioxide spacer layer 40' covering the device 10 having a thickness from about 500 Å to about 1500 Å has been formed over the device 10.

Figure 1H:
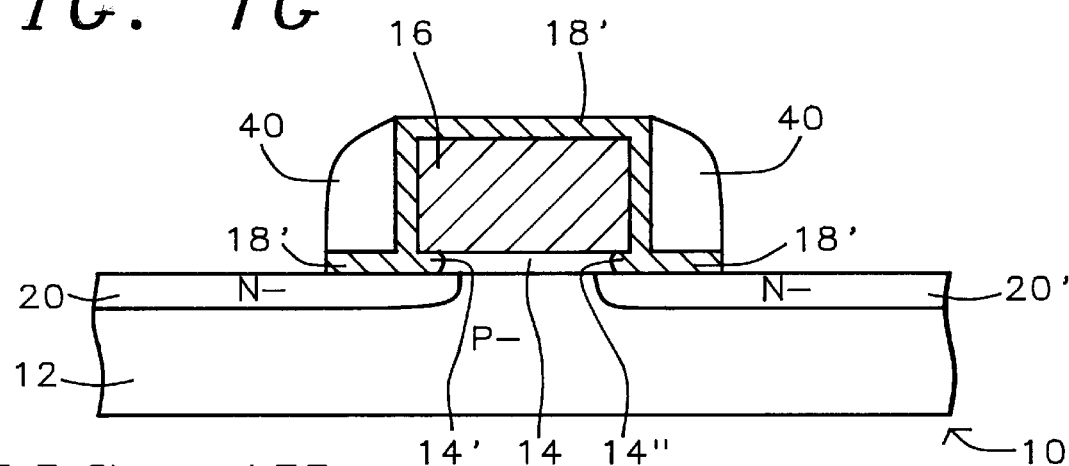
Figure 1I:
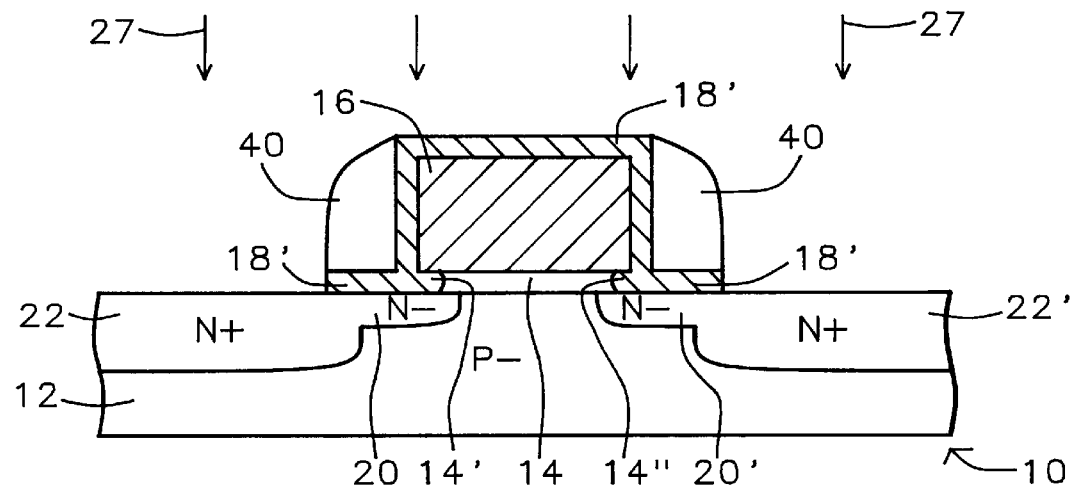
Figure 1J:
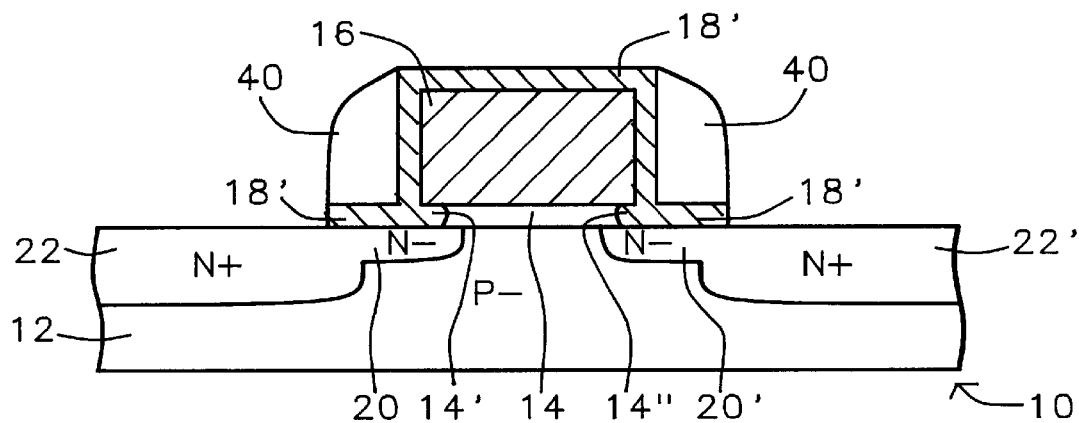

Next, referring to FIG. 1H, the spacer layer 40' on device 10 of FIG. 1G has been subjected to a spacer etch 353 back to yield the spacers 40 seen in FIGS. 1H–1J. In addition to forming the spacers 40, the spacer etching process etches away those portions of layer 18' aside from the spacers 40 down to the surface of substrate 12, above portions of lightly doped drain (LDD) N- regions 20, 20'.

FIG. 1I shows the device 10 of FIG. 1H after the source/drain regions 22, 22' have been heavily doped in a process of self-aligned doping of those regions with arsenic (As) dopant 27 with a concentration from about about $5\times10^{19}$ atoms/cm$^3$ to about $1\times10^{21}$ atoms/cm$^3$ formed by ion implanting at an energy level from about 25 keV to about 80 keV.

FIG. 1J shows the product of FIG. 1I after completion of processing in accordance with this invention.

Figure 2:
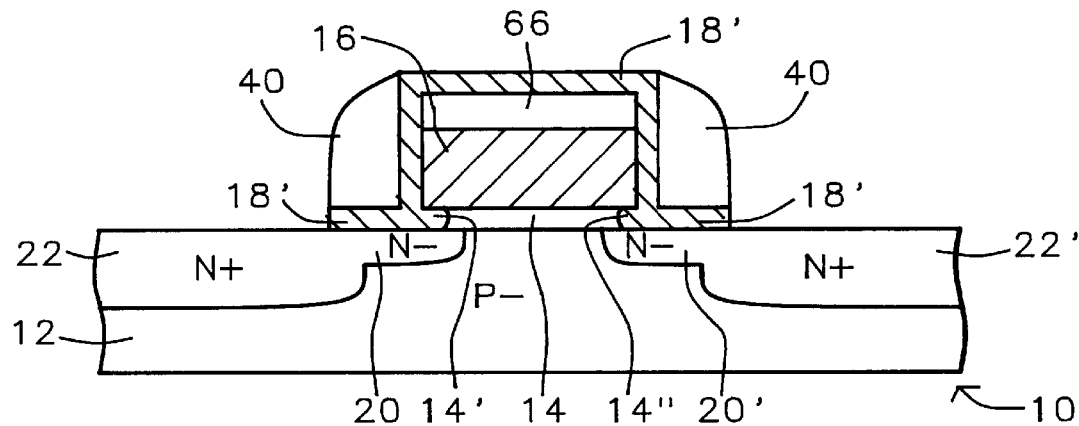
FIG. 2 shows a modification of FIG. 1 in which an alternative process in accordance with this invention is employed with a $WSi_x$ layer deposited on the polysilicon to form a polycide type of gate electrode.

FIG. 2 shows a modification of FIG. 1 in which an alternative process in accordance with this invention is employed. The same process is employed except that after the step of FIG. 1B, a WSi$_x$ layer 66 was deposited on the polysilicon layer 16 to form a polycide type of gate electrode formed of layers 16 and 66. The WSi$_x$ layer 66 was formed by chemical vapor deposition (CVD) by the reaction of dichlorosilane (DCS) SiH$_2$Cl$_2$ and tungsten hexafluoride (WF$_6$) which does not introduce significant fluorine (F) into the gate oxide layer.

Figure 3:
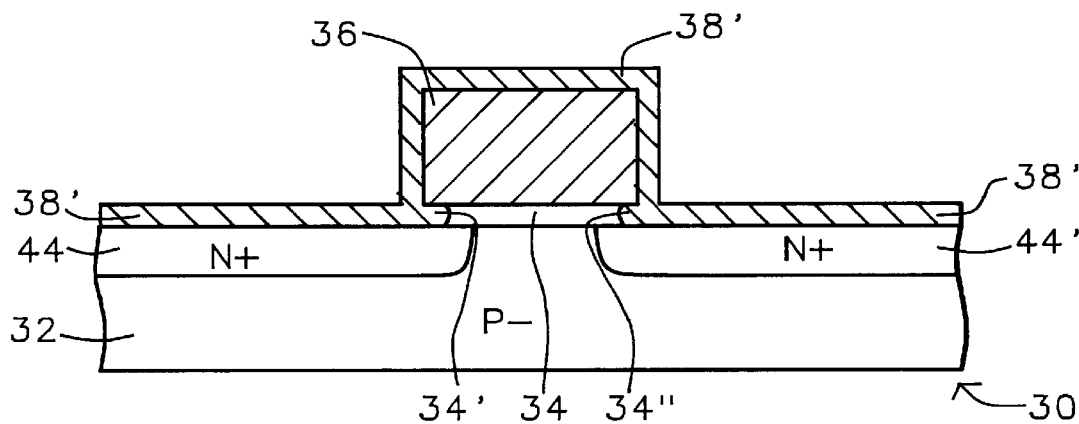
FIG. 3 shows an FET transistor device in accordance with this invention manufactured without any LDD regions.
Figure 4:
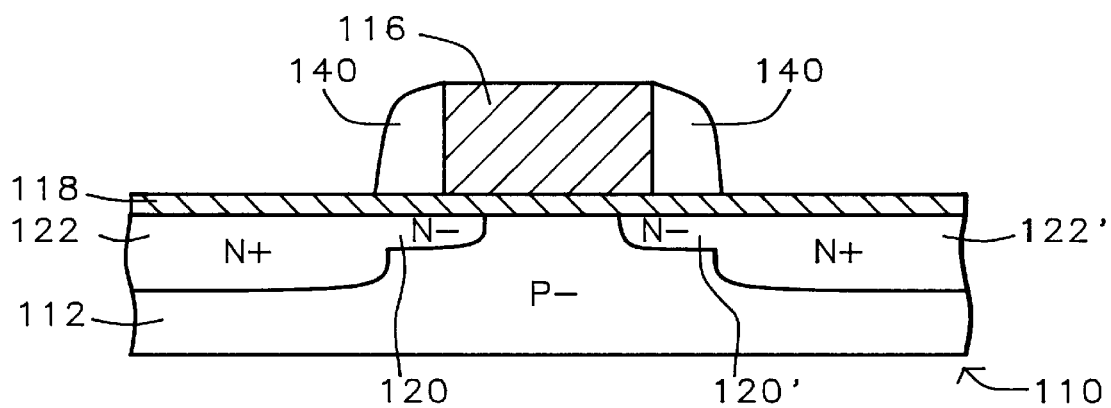
FIG. 4 shows an FET transistor device manufactured with LDD regions, as well as, source/drain regions. The P- doped silicon semiconductor substrate has an upper surface upon which is formed a fluorinated gate oxide layer composed of silicon oxide with a polysilicon gate electrode formed over the exposed top surface of gate oxide layer. A tungsten silicide ($WSi^x$) layer has been deposited by a CVD process based on a $SiH_4$ and $WF_6$ reaction with fluorine introduced into the polysilicon and consequently to the gate oxide by the annealing cycle.
Figure 5:
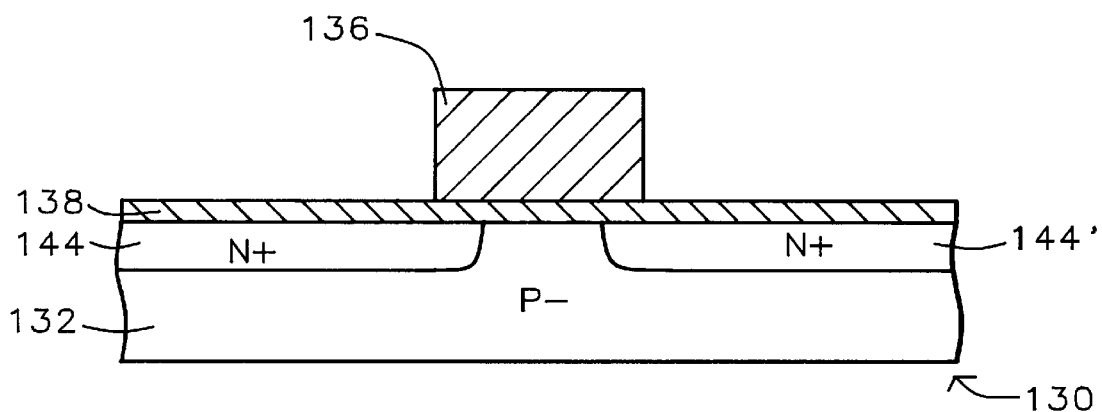
FIG. 5 shows an FET transistor device 130 manufactured with source/drain regions, without any LDD regions. A P- doped silicon semiconductor substrate has an upper surface with a gate oxide layer with a polysilicon gate electrode formed over the exposed top surface of fluorinated gate oxide layer, and a tungsten silicide ($WSi_x$) layer based on a $SiH_4$ and $WF_6$ reaction with fluorine being introduced into the polysilicon and consequently to the gate oxide by the annealing cycle.

FIG. 3 shows an FET transistor device 30 in accordance with this invention manufactured without any LDD regions. A P- doped silicon semiconductor substrate 32 has an upper surface upon which is formed gate oxide layer 34 composed of silicon oxide. The gate oxide layer 34, with a thickness from about 50 Å to about 150 Å, is formed by thermal processing or chemical vapor deposition.

A polysilicon gate electrode 36 has been formed over the exposed top surface of gate oxide layer 34. Layer 36 has been highly doped with arsenic (As) or phosphorus (P) dopant 15 with a concentration from about $1\times10^{19}$ atoms/cm$^3$ to about $5\times10^{21}$ atoms/cm$^3$ formed by ion implanting at an energy level from about 20 keV to about 50 keV.

A thin fluorinated silicon oxide dielectric layer 38' has a thickness from about 200 Å to about 400 Å formed as described above in connection with FIGS. 1A–1D.

The fluorinated silicon oxide layer 38' is composed of silicon oxide and fluorine. The resulting fluorine (F) concentration is about $5\times10^{20}$ atoms/cm$^3$.

There are portions 34' and 34" of the gate oxide layer 34 at the periphery of the gate electrode 36 above the substrate 32 which have fluorine incorporated therein extending from about 100 Å to about 500 Å from the sidewall of the gate electrode 36 beneath the lower surface of the gate electrode 36.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. An FET transistor comprising:

a stack of a gate oxide layer and a gate electrode on a surface of a doped semiconductor substrate with counterdoped source/drain regions therein, said gate electrode having sidewalls, a silicon oxide layer over said stack of said gate oxide layer and said gate electrode and over exposed portions of said semiconductor substrate including said source/drain regions, said silicon oxide layer and the corners of said gate oxide layer beneath said lower surface of said gate electrode having been fluorinated by rapid thermal processing providing a fluorinated silicon oxide layer extending beneath said lower surface of said gate electrode from about 100 Å to about 500 Å from said sidewalls of said gate electrode.

2. A transistor in accordance with claim 1, wherein said rapid thermal processing was performed in an atmosphere of NF$_3$ gas and O$_2$ gas and said fluorinated silicon oxide layer has a thickness from about 200 Å to about 400 Å.

3. A transistor in accordance with claim 1 wherein said rapid thermal processing was performed at a temperature from about 900° C. to about 1050° C. and said fluorinated silicon oxide layer has a thickness from about 200 Å to about 400 Å.

4. A transistor in accordance with claim 1 wherein said rapid thermal processing was performed at a temperature from about 900° C. to about 1050° C. for a time duration from about 10 seconds to about 50 seconds and said fluorinated silicon oxide layer has a thickness from about 200 Å to about 400 Å.

5. A transistor in accordance with claim 1 wherein said rapid thermal processing was performed in an atmosphere of NF$_3$ gas and O$_2$ gas at a temperature from about 900° C. to about 1050° C. and said fluorinated silicon oxide layer has a thickness from about 200 Å to about 400 Å.

6. A transistor in accordance with claim 1 wherein said rapid thermal processing was performed in an atmosphere of NF$_3$ gas and O$_2$ gas at a temperature from about 900° C. to about 1050° C. for a time duration 10 seconds to 50 seconds, and said fluorinated silicon oxide layer has a thickness from about 200 Å to about 400 Å.

7. A transistor in accordance with claim 1 wherein the gate electrode comprises a polycide structure comprising a layer of polysilicon and a tungsten silicide layer.

8. An FET transistor comprising:

a stack of a gate oxide layer and a gate electrode on a surface of a doped semiconductor substrate with counterdoped source/drain regions therein, said gate electrode having sidewalls, a silicon oxide layer over said stack of said gate oxide layer and said gate electrode and exposed portions of said semiconductor substrate including said source/drain regions, said silicon oxide layer having a thickness from about 200 Å to about 400 Å, said silicon oxide layer and the corners of said gate oxide layer extending beneath said lower surface of said gate electrode from about 100 Å to about 500 Å from said sidewalls of said gate electrode, having been fluorinated by rapid thermal processing providing a fluorinated silicon oxide layer.

9. A transistor in accordance with claim 8 wherein said rapid thermal processing was performed in an atmosphere of $NF_3$ gas and $O_2$ gas at a temperature from about 900° C. to about 1050° C. for a time duration from about 10 seconds to about 50 seconds, and said fluorinated silicon oxide layer has a thickness from about 200 Å to about 400 Å.

10. A transistor in accordance with claim 9 wherein the gate electrode comprises a polycide structure comprising a layer of polysilicon and a tungsten silicide layer.

11. A transistor in accordance with claim 8 wherein the gate electrode comprises a polycide structure comprising a layer of polysilicon and a tungsten silicide layer.

12. An FET transistor comprising:

a doped semiconductor substrate with counterdoped source/drain regions therein, said substrate having a surface upon which is formed a stack of a gate oxide layer and a gate electrode, said gate oxide layer having a thickness from about 50 Å to about 150 Å, said gate electrode having sidewalls, a silicon oxide layer over exposed portions of said semiconductor substrate and said stack of said gate oxide layer and said gate electrode, said silicon oxide layer having a thickness from about 200 Å to about 400 Å, said silicon oxide layer and the corners of said gate oxide layer beneath said lower surface of said gate electrode having been fluorinated providing a fluorinated portion of said gate oxide layer extending beneath said gate electrode from about 100 Å to about 500 Å from said sidewalls of said gate electrode.

13. A transistor in accordance with claim 12 wherein:

fluorination has been provided by rapid thermal processing providing a fluorinated silicon oxide layer and said rapid thermal processing was performed in an atmosphere of $NF_3$ gas and $O_2$ gas at a temperature from about 900° C. to about 1050° C. for a time duration from about 10 seconds to about 50 seconds, and said fluorinated silicon oxide layer has a thickness from about 200 Å to about 400 Å.

14. A transistor in accordance with claim 12 wherein:

the gate electrode comprises a polycide structure comprising a layer of polysilicon and a tungsten silicide layer.

15. A transistor in accordance with claim 12 wherein:

fluorination has been provided by rapid thermal processing providing a fluorinated silicon oxide layer and said rapid thermal processing was performed in an atmosphere of $NF_3$ gas and $O_2$ gas at a temperature from about 900° C. to about 1050° C. for a time duration from about 10 seconds to about 50 seconds, said fluorinated silicon oxide layer has a thickness from about 200 Å to about 400 Å and the gate electrode comprises a polycide structure comprising a layer of polysilicon and a tungsten silicide layer.

* * * * *